United States Patent [19]

Caviglia et al.

[11] Patent Number: 5,103,277

[45] Date of Patent: Apr. 7, 1992

[54] RADIATION HARD CMOS CIRCUITS IN SILICON-ON-INSULATOR FILMS

[75] Inventors: Anthony L. Caviglia, Laurel; Andras F. Cserhati; John B. McKitterick, both of Columbia, all of Md.

[73] Assignee: Allied-Signal Inc., Morris Township, Morris County, N.J.

[21] Appl. No.: 627,123

[22] Filed: Dec. 13, 1990

Related U.S. Application Data

[63] Continuation-in-part of Ser. No. 405,385, Sep. 11, 1989, abandoned.

[51] Int. Cl.⁵ .................. H01L 27/01; H01L 29/78; H01L 27/02; G01T 1/24
[52] U.S. Cl. .................. 357/23.7; 357/23.12; 357/23.14; 357/29; 357/42
[58] Field of Search .................. 357/29, 23.7, 23.12, 357/42, 41, 23.14; 250/338.4, 370.07, 370.15, 370.14, 371, 386

[56] References Cited

U.S. PATENT DOCUMENTS

| | | | |
|---|---|---|---|
| 4,484,076 | 11/1984 | Thomson | 250/370.07 |
| 4,763,183 | 8/1988 | Ng et al. | 357/15 |
| 4,866,498 | 9/1989 | Myers | 357/51 |
| 4,875,086 | 10/1989 | Malhi et al. | 357/53 |
| 4,907,053 | 3/1990 | Ohmi | 357/23.7 |
| 4,914,491 | 4/1990 | Vu | 357/23.7 |

OTHER PUBLICATIONS

IEEE SOS/SOI Technology Workshop, Oct. 1987, by Caviglia et al., p. 80.
IEDM Conference Proceedings, Dec. 1987, pp. 274-277, by Brown et al.

Primary Examiner—Mark Prenty
Attorney, Agent, or Firm—Howard G. Massung; Robert A. Walsh

[57] ABSTRACT

Means for compensating for threshold voltage shifts of Metal Oxide Semiconductor Field Effect Transistors (MOS FETs) of a Large Scale Integrated Circuit device (LSI), where the threshold voltage shifts are induced by radiation dosage. The FETs are formed in a relatively thin layer of silicon on an insulator film supported by a substrate. The compensating means includes a pair of sensor FETs formed integrally with the LSI device, an operational amplifier and a back gate formed opposite the channel regions of the FETs of the LSI device. The sensor FETs develop an output voltage that is applied as one input to the operational amplifier. A reference voltage, equal to the sensor output voltage prior to exposure to radiation, is applied as a second input to the operational amplifier. The amplifier output is applied to the back gate. The sensor output voltage changes as a result of radiation dosage. The amplifier output then changes, altering the back gate voltage in a manner tending to restore the sensor output to the original value. Such change in the back gate voltage compensates for radiation induced changes in the threshold voltages of the FETs of the LSI device.

12 Claims, 3 Drawing Sheets

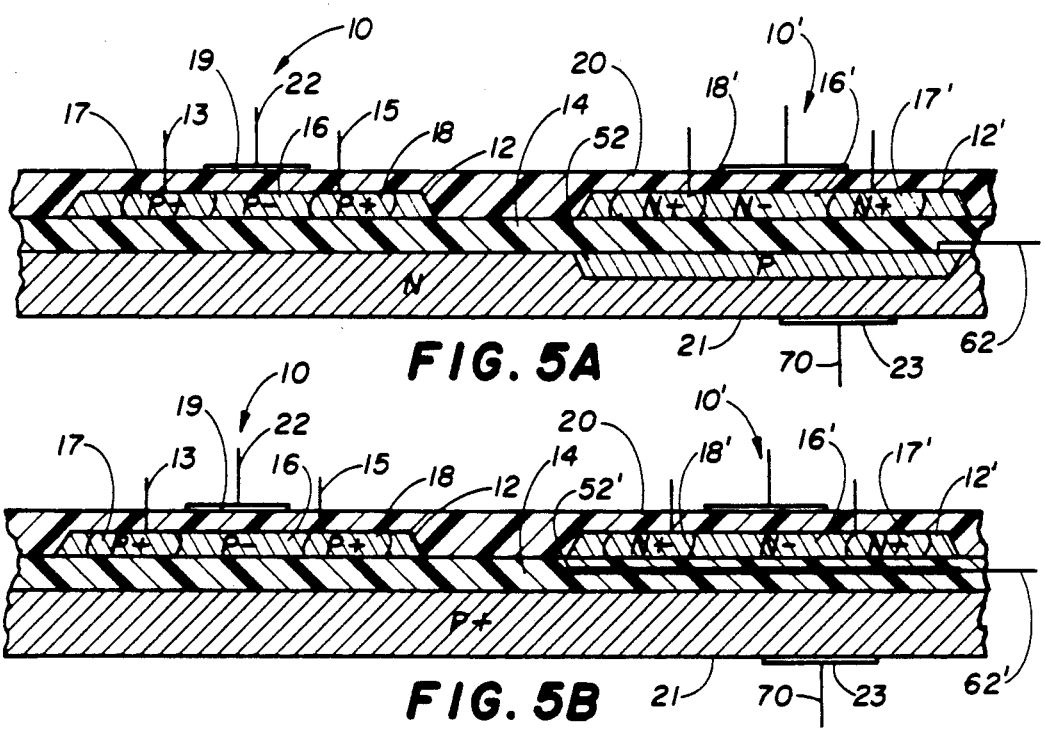
FIG. 5A
FIG. 5B
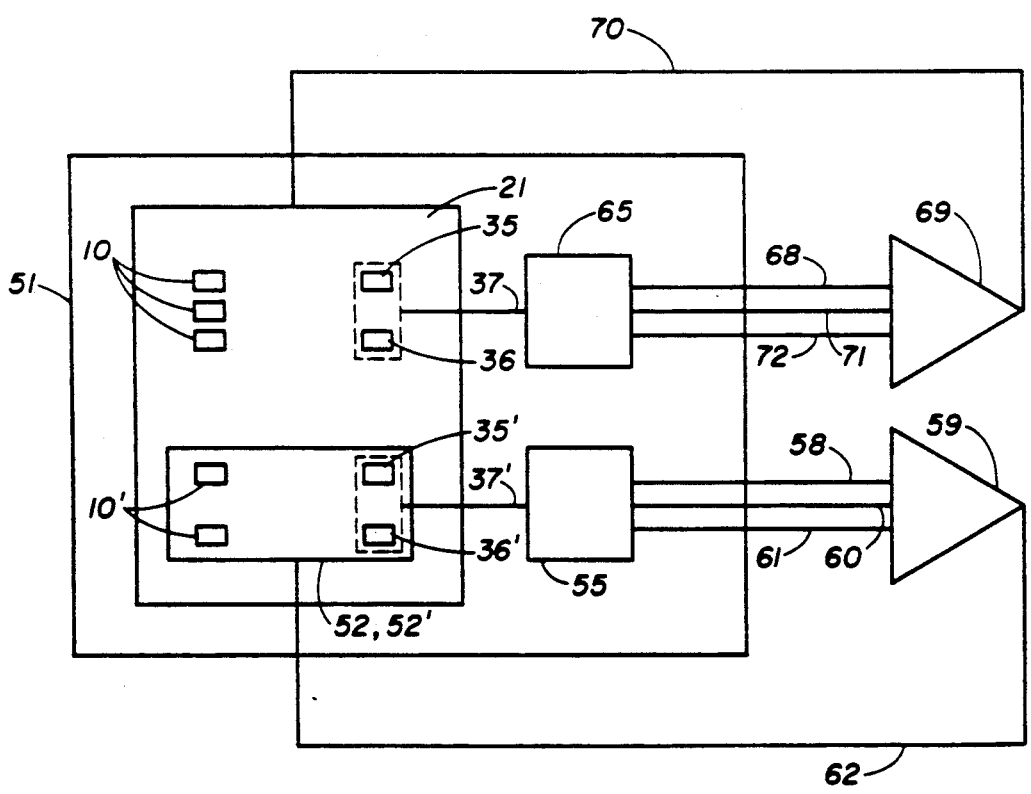
FIG. 6

RADIATION HARD CMOS CIRCUITS IN SILICON-ON-INSULATOR FILMS

RELATED APPLICATION

This application is a continuation-in-part of application Ser. No. 07/405,385, filed Sept. 11, 1989 and now abandoned.

FIELD OF THE INVENTION

The present invention relates to radiation resistant semiconductor circuits and more particularly to Silicon-on-Insulator (SOI) Complementary Metal Oxide Semiconductor (CMOS) circuits with increased resistance to total dose radiation.

BACKGROUND OF THE INVENTION

Radiation hard circuits are required for space and military applications. Generally, Silicon-on-Insulator Complementary Metal Oxide Semiconductor (SOI CMOS) devices are insensitive to transient radiation. They are, however, sensitive to total dose radiation effects.

The primary factor limiting the total dose radiation hardness of SOI CMOS devices is the excessive threshold voltage shift that occurs with increased radiation dosage. Ordinarily, the threshold voltages of both PMOS and NMOS devices increase negatively, and at the same rate of change, as the total radiation dose increases. When CMOS devices are incorporated in digital circuits, the effect of such threshold voltage shifts, most often, is that it becomes impossible to turn the circuits "on" or "off" using the normal signal voltages.

One method for increasing the radiation resistance of MOS devices is described in U.S. Pat. No. 4,748,131, issued May 31, 1988, to T. C. Zeitlow, titled "Method for Increasing Radiation Hardness of MOS Gate Oxides". In the method of the '131 patent, fluorine is introduced into the gate oxide by robust procedures which result in a significant reduction of radiation induced interface state density, thereby producing enhanced radiation hardened MOS devices.

U.S. Pat. No. 4,866,498, issued Sept. 12, 1989, to D.R. Myers, titled "Integrated Circuit with Dissipative Layer for Photogenerated Carriers" discloses a CMOS integrated circuit in which the conventional silicon dioxide layer supporting the active devices on a semiconductor substrate is replaced by a dissipative layer. Improved immunity to radiation induced single event upset of the active devices is thereby achieved.

In Silicon On Insulator Field Effect Transistors (SOI-FETs) formed in thin layers of silicon so that the depletion layer extends through the silicon film, the threshold voltage can be influenced by a back gate voltage. Some previous technical work on the radiation hardness of SOI CMOS devices has concentrated on simply testing the effects of total radiation on the devices. To reduce the charging of the insulator layer, frequently, a back gate formed on the surface of the substrate opposite the insulating layer is biased negatively during irradiation. However, this bias voltage is not used for dynamic threshold voltage adjustment.

U.S. Pat. No. 4,763,183, issued Aug. 9, 1988, to Ng et al., recognizes the possibility of controlling the threshold voltage of conventional MOSFET devices by applying an appropriate back gate voltage. However, in SOI devices, control of the threshold voltage by such means is dismissed as being impractical because the insulating region prevents the conduction of charge from the active region into the substrate. Instead, NG et al. modify the structure of the SOI device so as to include a conductive pathway extending from the active volume through the insulating region and into the substrate. Then control of the threshold voltage may be effected by application of a voltage to the substrate.

The temperature stabilization of threshold voltage with back gate bias is mentioned in a publication entitled "High Temperature Microelectronics - Expanding the Applications for Smart Sensors" by Brown et al., 1987 IEDM meeting sponsored by the IEEE in Washington, D.C., pp., 274–277. The technique is considered feasible because threshold voltage is a decreasing function of temperature and a increasing function of back gate bias. Brown et al. applied the bias voltage to the body of the transistor to compensate for threshold shifts due to temperature variations.

U.S. Pat. No. 4,484,076, issued Nov. 20, 1984, to I. Thomson for "Direct Reading Dosimeter" discloses a dosimeter for measuring total radiation dose in which the radiation induced change in threshold voltage of a MOSFET is measured to determine the radiation dose rate and total radiation dosage. The source of the sensor MOSFET is connected to a constant current supply, the drain thereof is grounded, and means are provided for periodically switching the gate of the sensor between ground and $+V$. During the time the gate of the sensor is grounded, the source to drain voltage of the sensor is a measure of the threshold voltage. The source-drain voltage of the sensor is amplified in an operational amplifier and then either applied directly to an indicator or applied to a differentiating amplifier to determine dose rate. Thomson does not recognize that the threshold voltage in a thin film SOI device can be influenced by a back gate voltage and does not utilize the output of the sensor FET, nor the outputs of the amplifiers connected thereto, to generate a back gate voltage to compensate for radiation induced threshold voltage shifts.

The threshold voltage of Silicon o Insulator Field Effect Transistors (SOI FETs) may be described by an analytical formula contained in an abstract by Caviglia et al, entitled "Threshold Voltage in Very Thin SOI-FETs", 1987 IEEE SOS/SOI Technology Workshop, Durango, Colorado, October 6–8, 1987.

SUMMARY OF THE INVENTION

In accordance with the present invention, means are provided for compensating for the threshold voltage shifts induced by radiation dosage in a Large Scale Integrated (LSI) circuit device made up of CMOS SOI FETs. The FETs of the device are formed in a relatively thin layer of silicon (50–1000 Å thick) on an insulating silicon oxide layer supported on the upper surface of a silicon substrate. A back gate voltage, controlled by the compensating means of the invention, is applied to a back gate, which may comprise the substrate, a metal layer imbedded in the insulating oxide opposite the channel regions of the FETs, or a reverse biased diode formed in the substrate opposite the channel areas of the FETs. The back gate voltage influences the threshold voltages of the FETs of the LSI device and is so controlled as to compensate for threshold voltage shifts induced by radiation dosage.

The compensating means of the invention includes a P-type FET (PFET) and an N-type FET (NFET)

formed integrally with the LSI device. The FETs of the compensating means are each formed, as is conventional, with source, drain and gate electrodes. The drains of the FETs are connected together and the sources thereof are connected across a voltage source to form a voltage divider. The gates of the FETs are connected in common to a fixed input voltage so as to produce a particular voltage at the drains thereof prior to exposure to radiation. The drain voltage is applied as one input to an operational amplifier. A reference voltage, corresponding to the pre-exposure drain voltage of the FETs, is applied as a second input to the operational amplifier. The output of the operational amplifier is applied to the metal area of the substrate of the LSI device as a back gate voltage.

After accumulating a radiation dosage the characteristics of the FETs are altered, causing the voltage at the drains thereof to change, which results in a change in the output of the operational amplifier, and the back gate voltage of the LSI device, in such a sense as to restore the voltage at the FET drains to the pre-exposure value. The resultant change in the back gate voltage of the LSI device compensates for the threshold voltage shifts of the FETs of the LSI device that were engendered by the radiation dosage.

It is an object of the invention to provide, in SOI CMOS devices fabricated in very thin, lightly doped silicon films, means for controlling the back gate voltage thereof whereby threshold voltage shifts induced by radiation dosage may be compensated for.

It is another object of the invention to detect the shift of the threshold voltages of PMOS and NMOS FETs caused by total dose radiation and to provide a feedback circuit to vary the back gate voltage to the FETs for controlling the threshold voltages.

It is a further object of the invention to provide SOI CMOS devices fabricated in very thin, lightly doped SOI films so that the threshold voltage shifts due to total dose radiation for both the NMOS and PMOS devices is linearly related to the back gate voltages of the devices over a significant threshold voltage range, for example, over at least 1.5 volts.

BRIEF DESCRIPTION OF THE DRAWINGS

FIG. 5A is a cross section of a CMOS SOI device having separate back gates for the NMOS and PMOS FETs of the device;

FIG. 5B is a cross section of a variation of the device of FIG. 5A; and

FIG. 6 is a simplified schematic diagram of an embodiment of the invention for separately compensating for radiation induced threshold voltage shifts in the PMOS and NMOS FETs of a large scale CMOS integrated circuit, in accordance with the invention.

DESCRIPTION OF THE PREFERRED EMBODIMENTS

Figure 1:
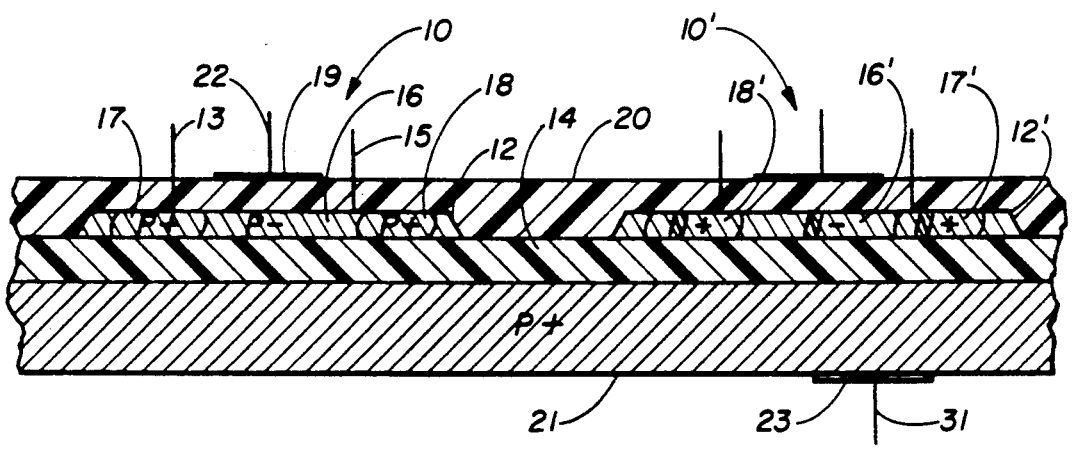
FIG. 1 is a cross section of a CMOS SOI FET device.

FIG. 1 is a cross section of a CMOS SOI incorporating a PMOS FET 10 and an NMOS FET 10'. The silicon-on-insulator (SOI) structure refers to layers of silicon 12, 12, (the silicon), which are isolated from one another for the PFETs and NFETs of the device, imposed on a layer 14 of silicon oxide (the insulator). Oxide layer 14 is supported by a semiconductor substrate 21, here silicon. The thickness of layer 14 may suitably be of the order of 5000 Å. Silicon layers 12, 12' are very thin, having a thickness of between 50–1000 Å and preferably of about 250 Å. Layer 12 may be either pure silicon or lightly doped with a P-type dopant. Layer 12' may be either pure silicon or lightly doped with an N-type dopant. Substrate 21 may be lightly or heavily doped with an N-type or P-type dopant. The dopant type and level is not of material importance to the invention. Here the substrate 21 is shown as being heavily doped with P type dopant.

As used herein, the term "lightly doped" means doping at a level of not greater than $1 \times 10^{16}$ atoms per cubic centimeter and the term "heavily doped" means doping at a level greater than $1 \times 10^{19}$ atoms per cubic centimeter. Lightly doped regions in FIG. 1 are indicated by the symbol "P-" or "N-" and heavily doped regions are indicated by the symbol "P+" or "N+".

A source 17 and a drain 18 are formed in layer 12 by heavily doping those regions with P type dopant. A channel 16 separates the source 17 from the drain 18. An insulating layer 20 of silicon oxide overlies channel 16 and may extend completely over the source 17 and drain 18 A metal layer, extending over the channel 16, is superimposed on layer 20 to form a front gate 19. A metal area 23 on the lower surface of substrate 21 provides electrical contact to the substrate for applying a back gate voltage thereto. The entire substrate 21 serves as a back gate for all FETs, both NMOS and PMOS of the LSI device Leads 13, 15, 22, and 31 are conductively connected, respectively, to the source 17, drain 18, gate 19 and area 23 on substrate 21 to form source, drain, gate and back gate electrodes.

The NMOS FET 10' is similar in form to PMOS FET 10 and differs from PMOS FET 10 only in that the dopants used in silicon layer 12' for the source 17', drain 18', and channel 16' regions are of the N type and in that the channel dimensions may differ in length and width from those of the P type to account for differences in the mobilities of the different types of charge carriers, as is well known to those skilled in the art. The essential feature of both types of FETs is that the silicon layers 12, 12' be very thin, between 50–1000 Å in thickness, and preferably about 250 Å in thickness.

When the FETs, whether NMOS or PMOS, are formed in very thin layers of silicon, it is possible to influence the threshold by a bias voltage applied to the back gate of the device. On the other hand, when the FETs are formed in relatively thick films of silicon or in bulk silicon, variation of the back gate bias has virtually no influence on the threshold voltages of the devices.

Figure 2:
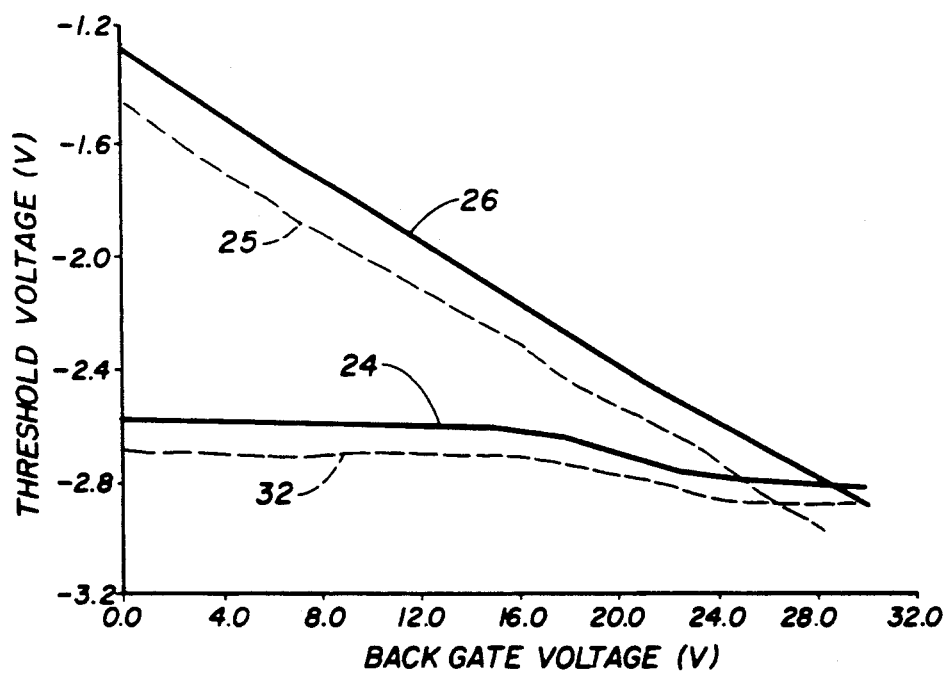
FIG. 2 is a graph showing the threshold voltage v. back gate voltage of an SOI FET fabricated in a relatively thin layer of silicon, and the threshold voltage v. back gate voltage of a conventional SOI FET fabricated in a relatively thick layer of silicon.

FIG. 2 illustrates the difference between the threshold voltage v. back gate voltage characteristics for a PMOS FET fabricated in a relatively thin layer of silicon and a conventional PMOS FET fabricated in a relatively thick layer of silicon. Line 26 is the threshold voltage v. back gate voltage characteristic for a PMOS FET fabricated as described with reference to FIG. 1, where the silicon layer corresponding to layer 12 of FIG. 1 is 200 Å thick. Line 26 shows a substantially linear variation in threshold voltage from about 1.3 v. to about 2.8 v. for a variation in back gate voltage of from 0 to 28 v.

Line 24 is the threshold voltage v. back gate voltage characteristic for a PMOS FET similar to that of FIG. 1, except that the silicon layer corresponding to the layer 12 is 4000 Å thick. Line 24 shows a threshold voltage change of only about 0.25 volts for a change of back gate voltage of from 0 to 28 volts. It is evident that variation of the back gate voltage has virtually no influence on the threshold voltage of the FET fabricated in the relatively thick layer of silicon.

When a P-type FET has received a dose of radiation, the threshold voltage characteristic shifts negatively, as shown by the dotted line 25 for the FET fabricated in the thin layer of silicon, and by the dotted line 32 for the FET fabricated in the thick layer of silicon.

Figure 3:
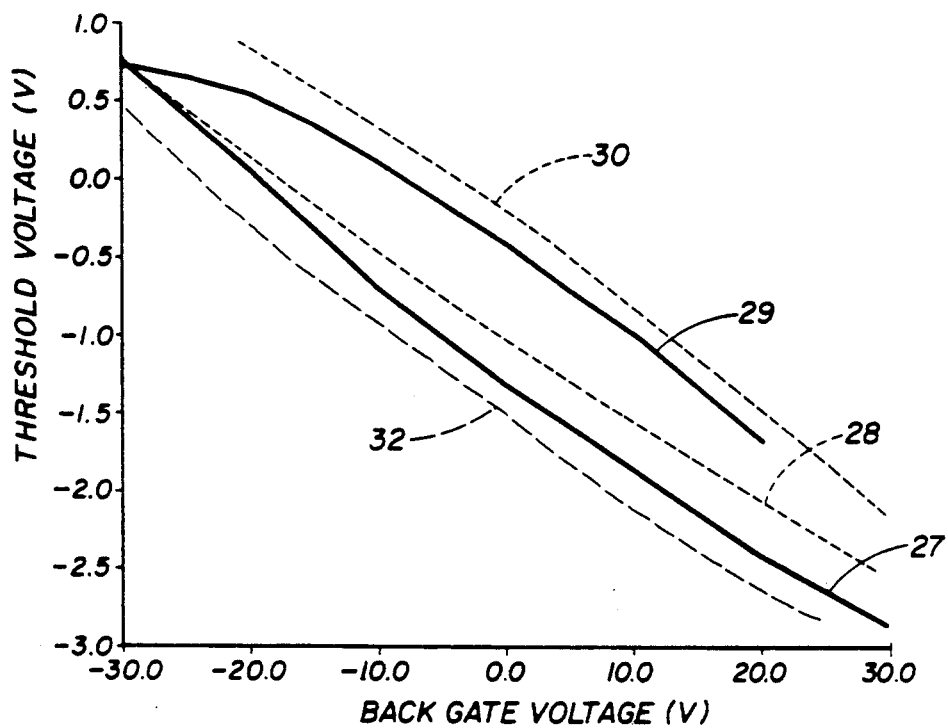
FIG. 3 is a graph showing the threshold voltage v. back gate voltage for a PMOS FET and for an NMOS FET, both fabricated in relatively thin SOI films.

FIG. 3 shows the calculated and the measured threshold voltages v. back gate voltage for a P-type FET and an N-type FET, both of which are of the SOI-type fabricated in thin silicon layers. Curve 27 is the measured threshold voltage v. back gate voltage for a PFET fabricated in a layer 12 of silicon 200 Å thick on a silicon oxide layer 14 5000 Å thick. Front gate oxide layer 20 is 250 Å thick. Silicon layer 12 and substrate 21 are both lightly doped with P-type dopants and the source 17 and drain 18 are heavily doped with P-type dopant. Curve 28 is the calculated threshold voltage v. back voltage for the FET used to obtain the data for curve 27.

Curve 29 is the measured threshold voltage v. back gate voltage for an NFET similar in form to the PFET used for curve 27 except that the silicon layer 12 is 300 Å thick and that the P-type dopants are replaced by N-type dopants. Curve 30 is the calculated threshold voltage v. back gate voltage for the FET used to obtain the data for curve 29.

When a radiation dose has been accumulated by the PFET, the threshold voltage curve 27 shifts toward the dashed line 32 in a direction to cause the threshold voltage to become more negative. The threshold voltage curve 29 for the N-type FET also shifts toward the dashed line 32 after accumulating radiation dose, causing the threshold voltage to become more negative. Although it is not apparent from FIG. 3, the source to drain currents of both the P-type and the N-type FETs vary with back gate voltage in the same manner as is seen in the threshold voltage v. back gate voltage curves of FIG. 3. After reception of a radiation dose, these currents of both the P-type FET and the N-type FET shift in the same manner as the threshold voltages shift for the respective types of FETs, assuming that source to drain and front gate voltages remain unchanged. In effect, the source to drain impedances of both types of FETs change as a result of radiation dosage. The changes in impedances induced by radiation are similar to the radiation induced changes in the threshold voltages. Such changes in the impedances enable radiation dosage to be sensed and compensated for by controlling the back gate voltage so as to reduce the impedance changes. Such compensation simultaneously compensates for the radiation induced changes in threshold voltages.

Figure 4:
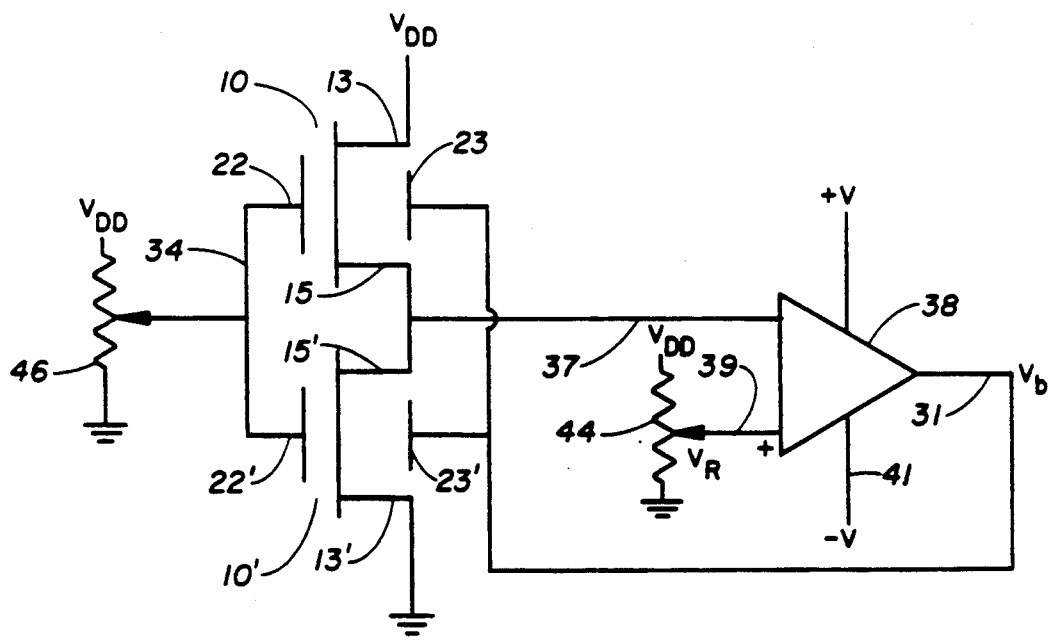
FIG. 4 is a schematic diagram of a circuit responsive to radiation dosage for controlling the voltage applied to the back gate of an LSI device, in accordance with the invention.

FIG. 4 is a schematic diagram of a radiation dosage monitoring circuit for a LSI CMOS SOI device with means for controlling the common back gate voltage of all the FETs of the LSI device. The LSI device is not shown in FIG. 4 but it should be understood that all PMOS and NMOS FETs of the LSI device are formed on a common substrate and that the back gate voltage developed by the circuit of FIG. 4 is applied to the substrate, which comprises the back gate for all the FETs of the LSI device.

The circuit of FIG. 4 includes a pair of sensing FETs, PFET 10 and NFET 10', formed integrally with the LSI device. PFET 10 and NFET 10' are similar to those described with reference to FIG. 1, having source 13, 13', drain 15, 15' and gate 22, 22' electrodes. The silicon layer of the LSI device, corresponding to layer 12 of FIG. 1, may suitably be 250 Å thick. The oxide layer corresponding to layer 14 may suitably be 5000 Å thick and the front gate oxide layer corresponding to layer 20 may suitably be 250 Å thick. The source 13' of NFET 10' is grounded and the drain 15' thereof is connected to the drain 15 of PFET 10. The front gate electrodes 22, 22' of FETs 10, 10' are connected together by lead 34. Source electrode 13 of PFET 10 is connected to a positive voltage source $V_{DD}$. Potentiometer 46 is connected between voltage source $V_{DD}$ and ground to provide an adjustable voltage on lead 34.

The commonly connected drains 15, 15' of FETs 10, 10' are connected to the inverting input 37 of an operational amplifier 38. A potentiometer 44, connected between voltage source $V_{DD}$ and ground, provides an adjustable reference voltage $V_R$ that is applied to the non-inverting input 39 of amplifier 38. Amplifier 38 receives positive and negative operating voltages +V, −V, on leads 40 and 41, respectively. The output $V_b$ of amplifier 38 is connected by lead 31 to the metal area 23 of substrate 21 that forms the back gate electrodes of FETs 10, 10'.

Prior to exposure to radiation, a particular voltage will be developed at the commonly connected drains 15, 15, of FETs 10, 10', depending upon the relative source to drain impedances thereof. Potentiometer 44 is adjusted to provide a reference voltage on lead 39 equal to that particular voltage. As a radiation dose is accumulated, the relative impedances of the FETs change, causing the voltage on amplifier input 37 to increase above the value $V_R$, in the example given.

The output $V_b$ of amplifier 38 is given by:

$$V_b = -A(V_R - V_{37})$$

where:

$V_{37}$ is the voltage on input 37 of amplifier 38; and

A is the gain of amplifier 38.

Consequently, $V_b$ changes in a positive sense as a result of the radiation dose. As may be inferred from FIG. 3, such a change in $V_b$, the back gate voltage, tends to restore the relative impedances of PFET 10 and NFET 10' to their pre-exposure values. Such change in the back gate voltage compensates for the shift in threshold voltages of all FETs of the LSI device brought on by the radiation dose.

In alternative embodiments of the circuit of FIG. 4 (not shown in the drawings), either PFET 10 or NFET 10' may be replaced by a fixed impedance, such as a resistor. Such a modification may necessitate interchanging the connections to the inverting input 37 and non-inverting input 39 of operational amplifier 38, depending on whether PFET 10 or NFET 10' is replaced by the fixed impedance, as will be understood by those skilled in the art.

Although the circuit of FIG. 4 will usually serve to compensate for the dosage induced threshold voltage shifts of both the PFETs and the NFETs of a CMOS LSI device, in certain applications it may be desirable to provide separate compensation for the PFETs and the NFETs of the LSI device.

Where separate back gate biases are to be applied to the respective back gates of the PFETs and NFETs formed on a common substrate, the back gates of the respective FETs must be electrically isolated from one another to prevent current flow between the respective bias sources. FIGS. 5A and 5B illustrate two alternative means for electrically isolating the back gate of the PFETs from the back gate of the NFETs in an LSI device.

Referring to FIG. 5A, the FETs 10, 10' of the device are formed as described with reference to FIG. 1, except that the substrate 21 is doped with an N-type dopant. An area 52, extending on the top surface of substrate 21, over at least the channel regions 16' of all NFETs of the device is doped with a P-type dopant. The doping levels of substrate 21 and region 52 are not of material importance. A conductive lead 62, insulated from substrate 21, is connected to area 52 for application of a back gate bias potential thereto. Substrate 21 forms the back gate for all PFETs of the device. A conductive lead 70 is attached to metal area 23 on substrate 21 for application of a back gate bias potential to the substrate. So long as the bias potential on lead 70 is maintained more positive than the bias potential on lead 62, the junction between region 52 and substrate 21 forms a reverse biased diode and no current will flow between the respective back gate bias sources.

FIG. 5B illustrates an alternative means for isolating the back gates of the PFETs and NFETs of a device from one another.

The PFETs 10 and NFTEs 10' of the device are formed as described with reference to FIG. 1. A metal layer 52' is embedded in oxide layer 14 opposite at least the channel regions 16' of all NFETs of the device to form a back gate. Conductive lead 62' is attached to layer 52' for application of a back gate bias potential thereto.

As before, substrate 21 forms the back gate for all PFETs of the device. Lead 70 is attached to metal area 23 on substrate 21 for application of a back gate bias potential to the substrate. Oxide layer 14 completely insulates metal layer 52' from the substrate and it is unnecessary to maintain the bias levels of the respective back gates in any particular relationship in order to prevent current flow between the respective bias sources.

FIG. 6 is a simplified schematic diagram of an embodiment of the invention wherein separate compensation is made for threshold voltage shifts of the PFETs and the NFETS of CMOS SOI LSI device 51. It will be understood that in FIG. 6 the representation of the layout of the device 51 is very much simplified over what will be seen in actual practice since the locations of the PFETs and the NFETs of the device will be interspersed with one another in a complex pattern.

The PFETs 10 and NFETs 10' of the device 51 are formed as described with reference to FIG. 5A or 5B on a substrate 21 which forms a common back gate 23 for all PFETs of the device 51. The NFETs 10' of the device 51 are formed over a common back gate, either a P doped area 52, as shown in FIG. 5A, or a metal layer 52', as shown in FIG. 5B.

A circuit for controlling the back gate voltage of all PFETs 10 of the device 51 is comprised by sensor circuit 65 and operational amplifier 69, which together correspond to the alternate embodiment mentioned in connection with the description of FIG. 4. Sensor 65 includes a PFET 10, formed integrally with the other PFETs 10 of device 51 on substrate 21. The drain of PFET 35 is connected to voltage source $V_{DD}$ and the source of PFET 35 is connected through resistor 57 to ground. A potentiometer 46, connected to voltage source $V_{DD}$, supplies an input voltage to the front gate of PFET 35. The source of PFET 35 is connected by lead 37 to the inverting input of operational amplifier 69. Potentiometer 44, connected to voltage source $V_{DD}$, provides a reference voltage through lead 72 to the non-inverting input of amplifier 69.

Operational amplifier 69 generates an output voltage $V_b$ in response to a change in the impedance of PFET 35 in the same manner as described with reference to FIG. 4. The output $V_b$ of amplifier 69 is applied through lead 70 to substrate 21 to control the back gate voltage of all PFETs of the device 51 and thereby compensate for dosage induced changes in the threshold voltages of all such PFETs.

The circuit for controlling the back gate voltage of all NFETs of the device 51 includes a sensing circuit 55 and operational amplifier 59. A back gate 52, or 52', serves as a common back gate for all NFETs 10' of the device 51. Sensor circuit 55 includes an NFET 36 formed integrally with the other NFETs 10' of device 51 over the common back gate 52 or 52'. A resistor 56 is connected from voltage source $V_{DD}$ to the source of NFET 36 and the drain of NFET 36 is grounded. Potentiometer 46' supplies an input voltage to the front gate of NFET 36. The source of NFET 36 is connected by lead 58 to the non-inverting input of amplifier 59 and potentiometer 44' provides a reference voltage to the inverting input of amplifier 59 through lead 60.

When the impedance of NFET 36 changes due to radiation dosage, amplifier 59 generates an output voltage $V_b'$ that may change at a different rate or in the opposite sense from the change that occurs in the output voltage $V_b$ of amplifier 69 as a result of the same radiation dosage. The output $V_b'$ of amplifier 59 is applied through lead 62 to the back gate 52 or 52' to control the back gate voltage of all NFETs of the device 51, including NFET 36, which tends to restore the impedance of NFET 36 to its original value, thereby simultaneously compensating for changes in the threshold voltages of all NFETs of the device 51 caused by radiation dosage. Obviously, variations in the invention are possible in the light of the above teachings. It is to be understood that the invention may be practiced otherwise than as specifically disclosed without departing from the spirit and scope of the appended claims.

The invention claimed is:

1. In a Metal Oxide Semiconductor (MOS) device constituted by a semiconductor substrate, an insulating layer formed on one surface of said substrate, a relatively thin layer of silicon formed on said insulating layer on the surface thereof opposite said substrate, and a plurality of Field Effect Transistors (FETs) formed in said silicon layer, said silicon layer being of a thickness such that a bias voltage applied to said substrate influences the threshold voltages of said FETs means for compensating for the shift in the threshold voltages of said FETs induced by radiation dosage, comprising:

a source of direct current having first and second terminals;

a first one of said FETs of said MOS device, said first FET having source, drain and front gate electrodes, said source electrode of said first FET being connected to one of said terminals of said current source;

an impedance connected in series between said drain electrode of said first FET and the other of s id terminals of said current source;

means for applying a first constant voltage to said front gate electrode of s id first FET to cause said first FET to conduct continuously and thereby develop a second voltage at the junction of said drain electrode of said first FET and said impedance;

an operational amplifier having a non-inverting input, an inverting input and an output;

means for applying said second voltage to one of said inputs of said amplifier;

means for applying a constant reference voltage to the other of said inputs of said amplifier, said reference voltage being equal to said second voltage prior to exposure of said first FET to radiation;

a back electrode formed on said substrate on the surface thereof opposite said FETs of said MOS device; and means for applying said output of said amplifier to said back gate electrode as a back gate bias for said FETs of said MOS device;

whereby, changes in the characteristics of said first FET induced by radiation dosage cause a change in the value of said second voltage and a consequent change in the output of said amplifier such that said back gate bias changes in manner tending to restore said second voltage to the value thereof prior to exposure of said first FET to radiation and thereby compensate for shifts in the threshold voltages of said FETs of said MOS device induced by radiation dosage.

2. Apparatus as claimed in claim 1, wherein:

said impedance is comprised by a second one of said FETs of said MOS device, said second FET having source, drain and front gate electrodes;

said drain electrode of said second FET being connected to said drain electrode of said first FET, said front gate electrode of said second FET being connected to said front gate electrode of said first FET, and said source electrode of said second FET being connected to said other terminal of said current source.

3. Apparatus as claimed in claim 2, wherein:

said back gate is comprised by said substrate, said substrate being doped with a charge carrying impurity.

4. In a Metal Oxide Semiconductor (MOS) device constituted by a semiconductor substrate, an insulating layer formed on one surface of said substrate, a relatively thin layer of silicon formed on said insulating layer on the surface thereof opposite said substrate, and a plurality of Field Effect Transistors (FETs) formed in said silicon layer, each of said FETs having a source, a drain, a channel and a front gate formed adjacent to said channel;

means for compensating for the shift in the threshold voltages of said FETs of said MOS device induced by radiation dosage, comprising:

a first P-type FET (PFET) formed in said silicon layer of said MOS device, said PFET having a source, a drain, a channel and a front gate formed adjacent to said channel;

a first N-type FET (NFET) formed in said silicon layer of said MOS device, said first NFET having a source, a drain, a channel and a front gate formed adjacent to said channel;

a common back gate formed opposite to said front gates of all said FETs of said MOS device, including said first PFET and said first NFET;

means connecting together said drains of said first PFET and said first NFET;

means connecting together said front gates of said first PFET and said first NFET;

a voltage source having first and second output terminals;

means connecting said source of said first PFET to said first terminal of said voltage source;

means connecting said source of said first NFET to said second terminal of said voltage source;

means for applying a first voltage to said front gates of said first PFET and said first NFET whereby said PFET and said NFET are caused to conduct to develop a second voltage at said drains thereof;

an operational amplifier having an inverting input, a non-inverting input and an output;

means for applying said second voltage to one of said inputs of said amplifier;

means for applying a reference voltage to the other of said inputs of said amplifier, said reference voltage being equal to said second voltage prior to exposure of said first PFET and said first NFET to radiation; and means for applying said output of said amplifier to said back gate electrode, whereby radiation induced changes in the characteristics of said first PFET and said first NFET causes a change in said output of said amplifier applied to said back gate which compensates for radiation induced changes in the threshold voltages of said FETs of said LSI device.

5. Apparatus as claimed in claim 4, wherein:

said common back gate is comprised by said substrate, said substrate being doped with a charge carrying impurity.

6. Apparatus as claimed in claim 5, wherein:

said relatively thin layer of silicon of said MOS device is from between 50 Å and 1000 Å in thickness.

7. Apparatus as claimed in claim 6, wherein:

said means for applying said first voltage to said gates of said first PFET and said first NFET includes a first potentiometer whereby said first voltage may be adjusted.

8. Apparatus as claimed in claim 7, wherein:

said means for applying said reference voltage to said other input of said amplifier includes a second potentiometer whereby said reference voltage may be adjusted.

9. In a Complementary Metal Oxide Semiconductor (CMOS) device constituted by a semiconductor substrate, an insulating layer formed on one surface of said substrate, a relatively thin layer of silicon formed on said insulating layer on the surface thereof opposite said substrate, a plurality of P-type Field Effect Transistors (PFETs) formed in said silicon layer, and a plurality of N-type Field Effect Transistors formed in said silicon layer, each of said PFETs and each of said NFETs including a source, a channel, a drain and a front gate formed adjacent to said channel, said silicon layer being of a thickness such that a bias voltage applied to said substrate influences the threshold voltages of said PFETs and said NFETs:

First and second means for compensating separately for the shift in the threshold voltages of said PFETs.and for the shifts in the threshold voltages of said NFETs of said MOS device induced by radiation dosage;

said first compensating means comprising:

a first one of said PFETs of said device and a first resistor connected in series as a first voltage divider, said first PFET having a source, a drain, a channel and a front gate formed adjacent to said channel;

a power supply having oppositely polarized terminals;

means connecting said first voltage divider across opposite terminals of said power supply;

means for applying a first voltage to said gate of said first PFET to cause said first PFET to conduct to develop a first sensor voltage from said first voltage divider;

a first operational amplifier having a non-inverting input, an inverting input and an output;

means for applying said first sensor voltage to one of said inputs of said first operational amplifier;

means for applying a first reference voltage to the other of said inputs of said first operational amplifier, said first reference voltage being equal to said first sensor voltage prior to exposure of said first PFET to radiation;

a first common back gate formed opposite said front gates of said PFETs of said CMOS device;

means for applying said output of said first operational amplifier to said first back gate electrode;

said second compensating means comprising:

a first one of said NFETs of said device and a second resistor connected in series as a second voltage divider, said first NFET having a source, a drain, a gate, a channel and a front gate adjacent to said channel, means connecting said second voltage divider across said opposite terminals of said power supply;

means for applying a second voltage to said gate of said first NFET to cause said first NFET to conduct to develop a second sensor voltage from said second voltage divider;

a second operational amplifier having a non-inverting input, an inverting input and an output;

means for applying said second sensor voltage to the one of said inputs of said second operational amplifier;

means for applying a second reference voltage to the other of said inputs of said second operational amplifier, said second reference voltage being equal to said second sensor voltage prior to exposure of said first NFET to radiation;

a second common back gate formed opposite to said front gates of all said NFETs of said CMOS device; and means for applying said output of said second operational amplifier to said second back gate;

whereby radiation induced changes in the characteristics of said first PFET will cause a change in said output of said first operational amplifier, thereby compensating for changes in the threshold voltages of said PFETs of said device, and whereby radiation induced changes in the characteristics of said first NFET will cause a change in said output of said second operational amplifier, thereby compensating for the changes in the threshold voltages of said NFETs of said device.

10. Apparatus as claimed in claim 9, wherein:

said first back gate is comprised by said substrate, said substrate being doped with an N-type dopant; and said second back gate is comprised by a region on the surface of said substrate adjacent said insulating later that is doped with a P-type dopant.

11. Apparatus as claimed in claim 9, wherein:

said first back gate is comprised by said substrate, said substrate being doped with a charge carrying impurity; and said second back gate is comprised by a metal layer imbedded in said insulated layer and insulated thereby from said substrate.

12. Apparatus as claimed in claim 9, wherein:

said relatively thin layer of silicon is from between 50 Å and 1000 Å in thickness.

* * * * *